United States Patent
Weisser et al.

(10) Patent No.: US 9,660,732 B2
(45) Date of Patent: May 23, 2017

(54) POWER ADJUSTMENT OF IN-PHASE AND QUADRATURE COMPONENTS AT A COHERENT OPTICAL RECEIVER

(75) Inventors: Stefan Weisser, Nuremberg (DE); Silvio Cucchi, Gaggiano (IT); Carlo Costantini, Casatenovo (IT); Noriaki Kaneda, Westfield, NJ (US); Andreas Leven, Bietigheim-Bissingen (DE)

(73) Assignee: Alcatel Lucent, Boulogne-Billancourt (FR)

( * ) Notice: Subject to any disclaimer, the term of this patent is extended or adjusted under 35 U.S.C. 154(b) by 382 days.

(21) Appl. No.: 13/637,481

(22) PCT Filed: Mar. 24, 2011

(86) PCT No.: PCT/EP2011/054519
§ 371 (c)(1),
(2), (4) Date: Nov. 14, 2012

(87) PCT Pub. No.: WO2011/131451
PCT Pub. Date: Oct. 27, 2011

(65) Prior Publication Data
US 2013/0101300 A1    Apr. 25, 2013

(30) Foreign Application Priority Data
Apr. 21, 2010 (EP) .................. 10305415

(51) Int. Cl.
*H04B 10/61* (2013.01)
*H03G 3/30* (2006.01)
(Continued)

(52) U.S. Cl.
CPC ......... *H04B 10/616* (2013.01); *H03G 3/3084* (2013.01); *H04B 10/60* (2013.01);
(Continued)

(58) Field of Classification Search
CPC .... H04B 10/60; H04B 10/613; H04B 10/616; H04B 10/6931
(Continued)

(56) References Cited

U.S. PATENT DOCUMENTS

| | | |
|---|---|---|
| 7,406,269 B2 | 7/2008 | Becker et al. |
| 7,636,525 B1 | 12/2009 | Bontu et al. |

(Continued)

FOREIGN PATENT DOCUMENTS

| | | |
|---|---|---|
| CN | 101395825 | 3/2009 |
| EP | 1986352 | 10/2008 |

OTHER PUBLICATIONS

Petrou, C. S. et al; Impact of Transmitter and Receiver Imperfections on the Performance of Coherent Optical QPSK Communication Systems; IEEE Lasers and Electro-Optics Society, 2008; LEOS 2008, 21st Annual Meeting of the, IEEE, Piscataway, NJ, USA; Nov. 9, 2008; pp. 410-411; XP031366277; ISBN: 978-1-4244-1931-9.

(Continued)

*Primary Examiner* — Shi K Li
(74) *Attorney, Agent, or Firm* — Patti & Malvone Law Group, LLC (57) ABSTRACT

It is disclosed an optical coherent receiver for an optical communication network. The optical coherent receiver is configured to receive a modulated optical signal and to process it for generating an in-phase component and a quadrature component. The optical coherent receiver comprises a power adjuster in turn comprising a multiplying unit and a retroactively connected digital circuit. The multiplying unit is configured to multiply the in-phase and quadrature components by in-phase and quadrature gains, respectively, thereby providing power-adjusted in-phase and quadrature components. The digital circuit is configured to compute: a (Continued)

common gain indicative of a sum of the powers of the power-adjusted in-phase and quadrature components; a differential gain indicative of a difference between the powers of the power-adjusted in-phase and quadrature components; and the in-phase and quadrature gains as a product and a ratio, respectively, between the common gain and the differential gain.

15 Claims, 5 Drawing Sheets

(51) Int. Cl.
*H04B 10/60* (2013.01)
*H04B 10/69* (2013.01)
*H04L 27/20* (2006.01)
*H04L 27/38* (2006.01)

(52) U.S. Cl.
CPC ....... *H04B 10/613* (2013.01); *H04B 10/6931* (2013.01); *H04L 27/2096* (2013.01); *H04L 27/3809* (2013.01); *H04L 27/3818* (2013.01)

(58) Field of Classification Search
USPC .......................................................... 398/210
See application file for complete search history.

(56) References Cited

U.S. PATENT DOCUMENTS

| 2007/0201879 A1 | 8/2007 | Liu |
| 2008/0038001 A1 | 2/2008 | Becker et al. |
| 2009/0129788 A1* | 5/2009 | Seimetz .................. 398/208 |
| 2009/0317075 A1 | 12/2009 | Mandai et al. |

OTHER PUBLICATIONS

Zhou, Xiang et al; Multi-Level, Multi-Dimensional Coding for High-Speed and High-Spectral-Efficiency Optical Transmission; Journal of Lightwave Technology, IEEE Service Center, New York, NY; US LNKD-DOI:10.1109/JLT.2009.2022765; vol. 27, No. 16; Aug. 15, 2009; pp. 3641-3653, XP011268786; ISSN: 0733-8724.

* cited by examiner

POWER ADJUSTMENT OF IN-PHASE AND
QUADRATURE COMPONENTS AT A
COHERENT OPTICAL RECEIVER

TECHNICAL FIELD

The present invention relates to the field of optical communications, in particular to coherent optical receivers for optical communication networks. Even more in particular, the present invention relates to power adjustment of in-phase and quadrature components at a coherent optical receiver for an optical communication network.

BACKGROUND ART

In a known optical communication network, digital data are typically transmitted in the form of modulated optical signals. In particular, the digital data to be transmitted are used for digitally modulating an optical carrier, i.e. one or more parameters (amplitude and/or phase and/or frequency) of the optical carrier are varied according to the digital data thereby generating a modulated optical signal. The modulated optical signal may be expressed by the following equation:

$$s(t)=A\cos(2\pi ft-\theta)=[A\cos\theta]\cos(2\pi ft)+[A\sin\theta]\sin(2\pi ft), \quad [1]$$

where A is the amplitude of the modulated optical signal, f is the frequency of the modulated optical signal, and $\theta$ is the phase of the modulated optical signal. Different types of digital modulations are known, such as for instance phase modulations (PSK, DPSK, QPSK, etc.) wherein $\theta$ is varied according to the digital data to be transmitted, and amplitude-phase modulations (QAM, etc.) wherein both A and $\theta$ are varied according to the digital data to be transmitted.

The modulated optical signal may be further expressed by the following equation:

$$s(t)=I\cos(2\pi ft)+Q\sin(2\pi ft), \quad [2]$$

where $I=A\cos\theta$ is typically termed in-phase component, while $Q=A\sin\theta$ is typically termed quadrature component.

At the reception side, the modulated optical signal is typically demodulated for retrieving the original digital data. A known receiver suitable for demodulating the modulated optical signal is the so-called "coherent optical receiver".

A coherent optical receiver typically comprises an analog portion, an analog-to-digital conversion portion and a digital portion. The analog portion typically comprises an opto-electrical circuit that generates two demodulation carriers $\cos(2\pi ft)$ and $\sin(2\pi ft)$ having frequency ideally equal to the frequency f of the modulated optical signal s(t), mixes them with the modulated optical signal s(t), processes the result of the mixing and opto-electrically converts it thereby providing at its output the in-phase component I and the quadrature component Q of the modulated optical signal s(t) in the form of two analog electrical signals. Then, the analog-to-digital portion typically performs an analog-to-digital conversion of the in-phase component I and the quadrature component Q, and the digital portion finally processes them for retrieving the digital data originally transmitted.

SUMMARY OF THE INVENTION

For allowing proper operation of the coherent optical receiver, both the in-phase component I and the quadrature component Q as received by the analog-to-digital conversion portion and/or by the digital portion should have their powers constantly equal to a nominal value.

Indeed, as to the analog-to-digital conversion portion, it typically quantizes the in-phase component I and the quadrature component Q using a number of quantization levels (typically, 256 quantization levels) ranging from −Sat to +Sat, Sat being a saturation value (a typical value of Sat is 127). If the power of the in-phase component I or the quadrature component Q exceeds the saturation level, quantization induces distortion. On the other hand, if the power of the in-phase component I or the quadrature component Q is much lower than the saturation level, only a very reduced number of the available quantization levels is used for quantizing, i.e. quantization is performed with a too low granularity. For the above reasons, at the input of the analog-to-digital conversion portion, the in-phase component I and the quadrature component Q should have their powers slightly lower than the saturation value. Similar considerations also apply to the digital portion.

However, the powers of the in-phase component I and the quadrature component Q typically vary in time.

In particular, due to the interaction with other co-propagating optical signals during transmission along the optical link, the optical power of the modulated optical signal s(t) is typically affected by time variations. As a consequence, the powers of the in-phase component I and the quadrature component Q vary in time by a same amount. In the present description and in the claims, variations by a same amount in the powers of the in-phase component I and the quadrature component Q will be termed "common variations".

Besides, the analog portion of the coherent optical receiver typically induces different power losses on the in-phase component I and the quadrature component Q. Such different power losses vary in time due to the thermal condition of the components comprised in the analog portion and their aging. As a consequence, the powers of the in-phase component I and the quadrature component Q vary in time by different amounts. In the present description and in the claims, variations by different amounts in the powers of the in-phase component I and the quadrature component Q will be termed "differential variations".

The powers of the in-phase component I and the quadrature component Q are typically affected by both common variations and differential variations.

In principle, the powers of the in-phase component I and the quadrature component Q may be adjusted by separately applying an ACG (Automatic Gain Control) mechanism to the in-phase component I and the quadrature component Q, with the aim of keeping the power of each component substantially equal to the nominal value.

However, this technique is disadvantageously not capable of controlling both common variations and differential variations. Indeed, common variations are typically very fast, because time variations undergone by the optical power of the modulated optical signal during transmission along the optical link are typically very fast. On the other hand, differential variations are typically very slow, because the variation of thermal condition and aging of the analog portion of the coherent optical receiver are very slow phenomena.

Hence, disadvantageously, an ACG mechanism separately applied to the in-phase component I and the quadrature component Q would not be capable of controlling both faster common variations and slower differential variations. This would disadvantageously lead to transients during which the in-phase component I and the quadrature component Q have different powers.

In view of the above, the Applicant has faced the problem of providing a coherent optical receiver which overcomes the aforesaid drawbacks, i.e. which is capable of adjusting the powers of the in-phase component I and the quadrature component Q so as to control both their common variations and their differential variations.

According to a first aspect, the present invention provides an optical coherent receiver for an optical communication network, the optical coherent receiver being configured to receive a modulated optical signal and to process the modulated optical signal for generating an in-phase component and a quadrature component, the optical coherent receiver comprising a power adjuster in turn comprising:

a multiplying unit configured to multiply the in-phase component by an in-phase gain thereby providing a power-adjusted in-phase component, and to multiply the quadrature component by a quadrature gain thereby providing a power-adjusted quadrature component; and a digital circuit retroactively connected between output and input of the multiplying unit and configured to compute:

a common gain indicative of a sum of a power of the power-adjusted in-phase component and a power of the power-adjusted quadrature component, and a differential gain indicative of a difference between the power of the power-adjusted in-phase component and the power of the power-adjusted quadrature component; and the in-phase gain as a product between the common gain and the differential gain, and the quadrature gain as a ratio between the common gain and the differential gain.

Preferably, the optical coherent receiver further comprises an analog-to-digital unit connected at the input of the power adjuster, the analog-to-digital unit being configured to sample the in-phase component and the quadrature component for providing N in-phase component samples and N quadrature component samples to the power adjuster at each clock cycle of a clock signal generated at the optical coherent receiver, N being an integer equal to or higher than 1.

In this case, preferably, the multiplying unit is a digital unit configured to multiply the N in-phase component samples by the in-phase gain thereby providing N power-adjusted in-phase component samples, and to multiply the N quadrature component samples by the quadrature gain thereby providing N power-adjusted quadrature component samples.

Alternatively, the multiplying unit is an analog unit.

In this case, preferably, the power adjuster comprises an analog-to-digital unit connected at the output of the multiplying unit, the analog-to-digital unit being configured to sample the power-adjusted in-phase component and the power-adjusted quadrature component for providing N power-adjusted in-phase component samples and N power-adjusted quadrature component samples at each clock cycle of a clock signal generated at the optical coherent receiver, N being an integer equal to or higher than 1.

Preferably, the digital circuit comprises a computation module configured to receive the N power-adjusted in-phase component samples and the N power-adjusted quadrature component samples and to calculate a common metric according to the following equation:

$$c = \sum_{k=0}^{N-1} \sqrt{|I'_k|^2 + |Q'_k|^2},$$

c being the common metric, $I'_k$ being the N power-adjusted in-phase component samples and $Q'_k$ being the N power-adjusted quadrature component samples.

Alternatively, the digital circuit comprises a computation module configured to receive the N power-adjusted in-phase component samples and the N power-adjusted quadrature component samples and to calculate a common metric according to the following equation:

$$c = \sum_{k=0}^{N-1} \left( \frac{|I'_k| + |Q'_k|}{\sqrt{2}} + \left(1 - \frac{1}{\sqrt{2}}\right) \cdot |||I'_k| - |Q'_k||| \right),$$

c being the common metric, $I'_k$ being the N power-adjusted in-phase component samples and $Q'_k$ being the N power-adjusted quadrature component samples.

Preferably, the digital circuit further comprises a cascade of an adder, a common multiplier and a common accumulator connected at the output of the computation module, wherein:

the adder is configured to calculate c−2T, T being a target value that the power of the power-adjusted in-phase component and the power of the power-adjusted quadrature component should reach;

the common multiplier is configured to calculate $S_c \cdot (c-2T)$, $S_c$ being a common loop gain; and the common accumulator is configured to update its content by adding $S_c \cdot (c-2T)$ to it, thereby providing an updated common content.

Preferably, the computation module is further configured to calculate a differential metric according to the following equation:

$$d = \sum_{k=0}^{N-1} (|I'_k| - |Q'_k|),$$

d being the differential metric, $I'_k$ being the N power-adjusted in-phase component samples and $Q'_k$ being the N power-adjusted quadrature component samples.

Preferably, the digital circuit further comprises a cascade of a differential multiplier and a differential accumulator connected at the output of the computation module, wherein:

the differential multiplier is configured to calculate $S_d \cdot d$, $S_d$ being a differential loop gain; and the differential accumulator is configured to update its content by adding $S_d \cdot d$ to it, thereby providing an updated differential content.

Preferably, the differential loop gain is lower than the common loop gain.

Preferably, the digital circuit further comprises an in-phase adder and a quadrature adder connected both to the common accumulator and to the differential accumulator, wherein:

the in-phase adder is configured to provide a sum of the updated common content and the updated differential content; and the quadrature adder is configured to provide a difference between the updated common content and the updated differential content.

Preferably, the digital circuit further comprises an in-phase exponential module connected between the in-phase adder and the multiplying unit and a quadrature exponential module connected between the quadrature adder and the multiplying unit, wherein:

the in-phase exponential module is configured to calculate the in-phase gain as a negative exponential function of the above sum; and the quadrature exponential module is configured to calculate the quadrature gain as a negative exponential function of the above difference.

According to a second aspect thereof, the present invention provides a node for a communication network comprising an optical coherent receiver according to any of the preceding claims.

According to a third aspect thereof, the present invention provides a method for adjusting power of an in-phase component and a quadrature component of a modulated optical signal received at an optical coherent receiver for an optical communication network, the method comprising:

multiplying the in-phase component by an in-phase gain thereby providing a power-adjusted in-phase component, and multiplying the quadrature component by a quadrature gain thereby providing a power-adjusted quadrature component; and retroactively computing:

a common gain indicative of a sum of a power of the power-adjusted in-phase component and a power of the power-adjusted quadrature component, and a differential gain indicative of a difference between the power of the power-adjusted in-phase component and the power of the power-adjusted quadrature component; and the in-phase gain as a product between the common gain and the differential gain, and the quadrature gain as a ratio between the common gain and the differential gain.

BRIEF DESCRIPTION OF THE DRAWINGS

Embodiments of the invention will be better understood by reading the following detailed description, given by way of example and not of limitation, to be read with reference to the accompanying drawings, wherein.

DETAILED DESCRIPTION OF PREFERRED EMBODIMENTS OF THE INVENTION

Figure 1:
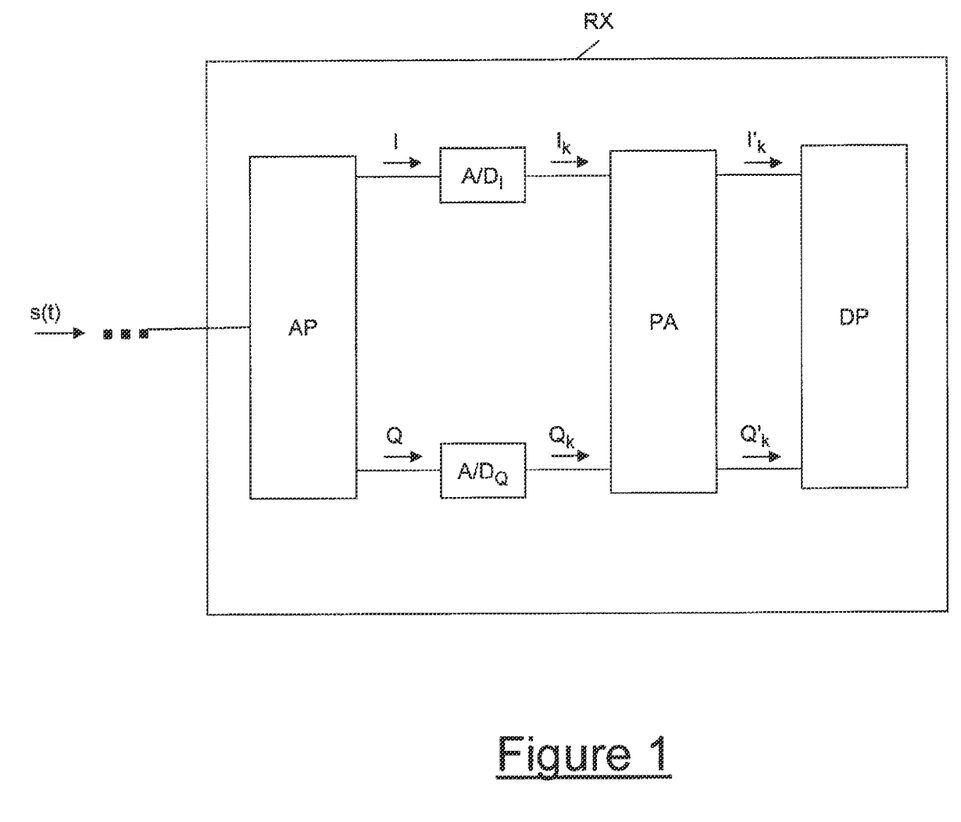
FIG. 1 is a block diagram of a coherent optical receiver according to a first embodiment of the present invention.

FIG. 1 schematically shows a coherent optical receiver RX according to a first embodiment of the present invention.

The coherent optical receiver RX preferably comprises an analog portion AP, an in-phase analog-to-digital converter $A/D_I$, a quadrature analog-to-digital converter $A/D_Q$, a power adjuster PA and a digital portion DP. The coherent optical receiver RX may comprise further modules, that are not shown in FIG. 1 and will not be described since they are not relevant to the present description.

The analog portion AP preferably has an input substantially corresponding to the input of the coherent optical receiver RX, and two outputs. The analog portion AP is preferably implemented as an arrangement of optical, electrical and electro-optical components. The physical implementation of the analog portion AP will not be described in detail, since it is not relevant to the present description.

Preferably, the in-phase analog-to-digital converter $A/D_I$ and the quadrature analog-to-digital converter $A/D_Q$ are connected to the outputs of the analog portion AP. The power adjuster PA preferably has two inputs and two outputs. The outputs of the in-phase analog-to-digital converter $A/D_I$ and the quadrature analog-to-digital converter $A/D_Q$ are preferably connected to the inputs of the power adjuster PA. The digital portion DP has two inputs, which are preferably connected to the outputs of the power adjuster PA.

When a modulated optical signal $s(t)=A \cos(2\pi ft-0)$ is received at the input of the optical coherent receiver RX, the analog portion AP preferably processes it for generating an in-phase component I of the modulated optical signal $s(t)$ and a quadrature component Q of the modulated optical signal $s(t)$. Both the in-phase component I and the quadrature component Q output by the analog portion AP are preferably in the form of analog electrical signals. The operation of the analog portion AP will not be described in further detail, since it is not relevant to the present description.

Then, according to this first embodiment, the in-phase analog-to-digital converter $A/D_I$ preferably samples the in-phase component I, thereby generating a sequence of in-phase component samples $I_k$. Substantially at the same time, the quadrature analog-to-digital converter $A/D_Q$ preferably samples the quadrature component Q, thereby generating a sequence of quadrature component samples $Q_k$.

Preferably, the power adjuster PA receives the in-phase component samples $I_k$ and multiplies them by an in-phase gain $G_I$, thereby providing corresponding power-adjusted in-phase component samples $I'_k$ at its output. Substantially at the same time, the power adjuster PA receives the quadrature component samples $Q_k$ and multiplies them by a quadrature gain $G_Q$, thereby providing corresponding power-adjusted quadrature component samples $Q'_k$ at its output. Preferably, the in-phase gain $G_I$ and the quadrature gain $G_Q$ are given by the following equations:

$$G_I = G_C \cdot G_D \quad [4a]$$

$$G_Q = G_C / G_D, \quad [4b]$$

where $G_C$ is a fast-varying common gain suitable for controlling possible common variations of the powers of the in-phase component I and the quadrature component Q, whereas $G_D$ is a slow-varying differential gain suitable for controlling possible differential variations of the powers of the in-phase component I and the quadrature component Q, as it will be described in further detail herein after. The in-phase gain $G_I$ and the quadrature gain $G_Q$ are preferably computed by the power adjuster PA based on the in-phase component samples $I_k$ and the quadrature component samples $Q_k$, as it will be described in further detail herein after.

Then, the power adjuster PA preferably forwards the power-adjusted in-phase component samples $I'_k$ and power-adjusted quadrature component samples $Q'_k$ to the digital portion DP, that processes them for retrieving the digital data originally transmitted. The operation of the digital portion DP depends on the type of digital modulation applied to the modulated optical signal s(t), and will not be described in further detail, since it is not relevant to the present description.

Figure 2:
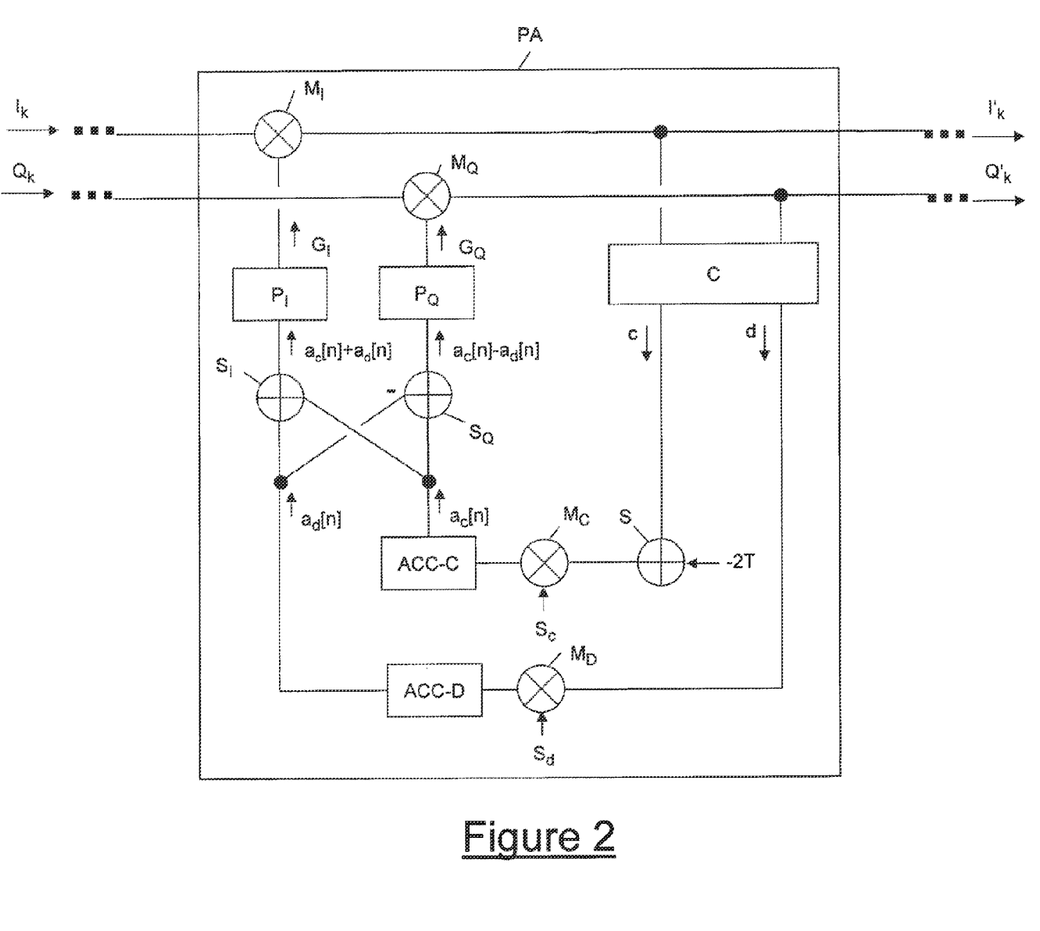
FIG. 2 is a more detailed block diagram of the power adjuster comprised in the coherent optical receiver of FIG. 1.

With reference to FIG. 2, the power adjuster PA according to the first embodiment of the present invention will be now described in detail.

The power adjuster PA preferably comprises an in-phase multiplier $M_I$, a quadrature multiplier $M_Q$, a computation module C, an adder S, an common multiplier $M_C$, a differential multiplier $M_D$, a common accumulator ACC-C, a differential accumulator ACC-D, an in-phase adder $S_I$, a quadrature adder $S_Q$, an in-phase exponential module $P_I$ and a quadrature exponential module $P_Q$. All the above components are preferably digital components, and they may be implemented as an ASIC.

The above components of the power adjuster PA are preferably arranged according to two partially overlapping feedback loops, the two feedback loops being configured to calculate the in-phase gain $G_I$ and the quadrature gain $G_Q$ according to the above equations [4a] and [4b].

In particular, one of the inputs of the in-phase multiplier $M_I$ and one of the inputs of the quadrature multiplier $M_Q$ correspond to the inputs of the power adjuster PA. Besides, preferably, the output of the in-phase multiplier $M_I$ and the output of the quadrature multiplier $M_Q$ correspond to the outputs of the power adjuster PA.

The computation module C has two inputs and two outputs. The outputs of the in-phase multiplier $M_I$ and the quadrature multiplier $M_Q$ are connected to the inputs of the computation module C. One of the outputs of the computation module C is connected to the common multiplier $M_C$ through the adder S, while the other one is directly connected to the differential multiplier $M_D$. The common multiplier $M_C$ is preferably connected to the common accumulator ACC-C, while the differential multiplier $M_D$ is preferably connected to the differential accumulator ACC-D. The outputs of the common accumulator ACC-C and the differential accumulator ACC-D are preferably connected to the inputs of both the in-phase adder $S_I$ and the quadrature adder $S_Q$. The in-phase adder $S_I$ is then connected to the in-phase exponential module $P_I$, that is in turn connected at one of the inputs of the in-phase multiplier $M_I$. Similarly, the quadrature adder $S_Q$ is connected to the quadrature exponential module $P_Q$, that is in turn connected at one of the inputs of the quadrature multiplier $M_Q$.

The power adjuster PA further preferably comprises a clock input (not shown in the drawings) configured to receive a clock signal from a clock unit (also not shown in the drawings) comprised in the receiver RX, and to provide it to all the components of the power adjuster PA for synchronizing their operation.

The functions of the various elements shown in FIG. 2 may be provided through the use of dedicated hardware, programmable hardware or a hardware capable of executing software in association with appropriate software. In particular, the functions of the various elements shown in FIG. 2 are preferably provided through the use of one or more application specific integrated circuits (ASIC) and/or one or more field programmable gate arrays (FPGA). Preferably, the functions of the various elements shown in FIG. 2 are provided through the use of a single ASIC or a single FPGA.

The operation of the power adjuster PA of FIG. 2 will be now described in detail.

As mentioned above, the power adjuster PA preferably receives at its inputs the in-phase component samples $I_k$ and the quadrature component samples $Q_k$ from the in-phase analog-to-digital converter $A/D_I$ and the quadrature analog-to-digital converter $A/D_Q$, respectively. In particular, at each clock cycle of the received clock signal, the power adjuster PA preferably receives at its inputs N in-phase component samples $I_k$ and N quadrature component samples $Q_k$, N being an integer equal to or higher than 1. The integer N is preferably equal to 128.

At each clock cycle, the in-phase multiplier $M_I$ preferably multiplies the N in-phase component samples $I_k$ by an in-phase gain $G_I$ that is currently output by the in-phase exponential module $P_I$ (and that has been calculated during the previous clock cycle), thereby providing at the output of the power adjuster PA N corresponding power-adjusted in-phase component samples $I'_k$. Substantially at the same time, the quadrature multiplier $M_Q$ preferably multiplies the N quadrature component samples $Q_k$ by a quadrature gain $G_Q$ that is currently output by the quadrature exponential module $P_Q$ (and that has been calculated during the previous clock cycle), thereby providing at the output of the power adjuster PA N corresponding power-adjusted quadrature component samples $Q'_k$.

The N power-adjusted in-phase component samples $I'_k$ and the N power-adjusted quadrature component samples $Q'_k$ are preferably received also at the computation module C. The computation module C is preferably provided with one or more storing devices suitable for storing N samples $I'_k$ and N samples $Q'_k$.

Then, the computation module C preferably computes a common metric c and a differential metric d. The common metric c is preferably indicative of the sum of the powers of the in-phase component I and the quadrature component Q after multiplication during the current clock cycle. On the other hand, the differential metric d is preferably indicative of the difference between the power of the in-phase component I and the power of the quadrature component Q after multiplication during the current clock cycle. In particular, the common metric c and the differential metric d are preferably computed according to the following equations:

$$c = \sum_{k=0}^{N-1} \sqrt{|I'_k|^2 + |Q'_k|^2} \qquad [5a]$$

$$d = \sum_{k=0}^{N-1} (|I'_k| - |Q'_k|). \qquad [5b]$$

Then, the common metric c is forwarded to the adder S, to the common multiplier $M_C$ and then to the common accumulator ACC-C. The adder S preferably subtracts 2T from the common metric c, the common multiplier $M_C$ multiplies the result by a common loop gain $S_c$, and the common accumulator ACC-C preferably updates its content by adding to it the result of the multiplication. T is a target value, i.e. the value that the power of the samples $I'_k$ and $Q'_k$ should reach when the feedback loop suitable for calculating the common gain $G_C$ reaches a steady state, as it will be described in detail herein after. The target value T may be configured and possibly changed according to the features of the digital portion DP (namely, the saturation value and granularity of the digital portion DP).

Substantially at the same time, the differential metric d is forwarded to the differential multiplier $M_D$ and then to the differential accumulator ACC-D. The differential multiplier $M_D$ multiplies the result by a differential loop gain $S_d$, and the differential accumulator ACC-D preferably updates its content by adding to it the result of the multiplication.

The content $a_c[n]$ of the common accumulator ACC-C and the content $a_d[n]$ of the differential accumulator ACC-D as updated during the current clock cycle are therefore given by the two following equations:

$$a_c[n]=a_c[n-1]+S_c\cdot(c-2t) \quad [6a]$$

$$a_d[n]=a_d[n-1]+S_d\cdot d, \quad [6b]$$

wherein $a_c[n-1]$ and $a_d[n-1]$ are the contents of the accumulators ACC-C and ACC-D, respectively, at the end of the previous clock cycle (i.e. before the updates performed at the current clock cycle). Basically, the accumulators ACC-C, ACC-D act as digital integrators calculating the integral of the common metric c and the differential metric d, respectively. Integrating the common metric c and the differential metric d advantageously allows "smoothing" the common variations and the differential variations of the components I and Q, and therefore basically provides a low-pass filtering function upon the in-phase gain $G_I$ and quadrature gain $G_Q$.

Advantageously, the values of the common loop gain $S_c$ and the differential loop gain $S_d$ may be independently selected. Preferably, they are selected so that $0<S_d<S_c<<1$. This advantageously implies that the variation in time of the content of the differential accumulator ACC-D is much slower than the variation in time of the content of the common accumulator ACC-C.

The updated contents $a_d[n]$ and $a_c[n]$ of the accumulators ACC-D and ACC-C are then forwarded to the in-phase adder $S_I$ and the quadrature adder $S_Q$. The in-phase adder $S_I$ calculates $a_c[n]+a_d[n]$, and sends the sum to the in-phase exponential module $P_I$ that calculates the in-phase gain $G_I$ according to the following equation:

$$G_I=2^{-a_c[n]-a_d[n]}. \quad [7a]$$

Besides, the quadrature adder $S_Q$ calculates $a_c[n]-a_d[n]$, and sends the difference to the quadrature exponential module $P_Q$ that calculates the quadrature gain $G_Q$ according to the following equation:

$$G_Q=2^{-a_c[n]+a_d[n]}. \quad [7b]$$

In other words, the in-phase gain $G_I$ and the quadrature gain $G_Q$ are calculated through a non-linear mapping of the contents $a_d[n]$ and $a_c[n]$. This basically provides a logarithmic control of the in-phase gain $G_I$ and the quadrature gain $G_Q$.

The in-phase gain $G_I$ and the quadrature gain $G_Q$ calculated according to the equations [7a] and [7b] during the current clock cycle based on the currently received N samples $I'_k$ and N samples $Q'_k$ will then be used for multiplying the N samples $I'_k$ and the N samples $Q'_k$ that will be received during the next clock cycle.

The above described operation of the power adjuster PA is preferably repeated at each clock cycle.

It can be noticed that the in-phase gain $G_I$ and the quadrature gain $G_Q$ calculated according to the equations [7a] and [7b] correspond to the in-phase gain $G_I$ and the quadrature gain $G_Q$ calculated according to the above equations [4a] and [4b], provided that:

$$G_C=2^{-a_c[n]} \quad [8a]$$

$$G_D=2^{-a_d[n]}. \quad [8b]$$

Therefore, when the power of the in-phase component I and the quadrature component Q are substantially equal to the target value T, the common metric c is substantially equal to 2T, and therefore the output of the adder S is substantially equal to zero. Hence, the content of the common accumulator ACC-C is substantially constant (or slightly oscillating) and, as a consequence, also the common gain $G_C=2^{-a_c[n]}$ is substantially constant. In other words, the feedback loop calculating the common gain is basically in its steady state. If, by way of example, the in-phase component I and the quadrature component Q undergo a common increase of their powers, the common metric c becomes higher than 2T, and accordingly the output of the adder S becomes positive. Hence, the content of the common accumulator ACC-C increases and, as a consequence, the common gain $G_C=2^{-a_c[n]}$ decreases. Therefore, both the in-phase gain $G_I$ and the quadrature gain $G_Q$ are decreased by a same amount, and accordingly the power of both the components I and Q is decreased by a same amount. This mechanism continues until the steady state is reached again (i.e. the powers of I and Q become again substantially equal to T). The rate at which the common gain $G_C=2^{-a_c[n]}$ evolves towards its steady state value basically depends on the common loop gain $S_c$.

On the other hand, when the power of the in-phase component I is equal to the power of the quadrature component Q, the differential metric d is substantially equal to zero. Hence, the content of the differential accumulator ACC-D is substantially constant (or slightly oscillating) and, as a consequence, also the differential gain $G_D=2^{-a_d[n]}$ is substantially constant. In other words, the feedback loop calculating the differential gain is basically in its steady state. If, by way of example, the power of the in-phase component I increases relative to the power of the quadrature component Q, the differential metric d becomes positive. Hence, the content of the differential accumulator ACC-D increases and, as a consequence, the differential gain $G_D=2^{-a_d[n]}$ decreases. Therefore, the in-phase gain $G_I$ is decreased by a given amount, while the quadrature gain $G_Q$ is increased by a same amount. Accordingly the power of the component I is decreased by a given amount, while the power of the component Q is increased by a same amount. This mechanism continues until the steady state is reached again (the power of I becomes equal to the power of Q). The rate at which the differential gain $G_D=2^{-a_d[n]}$ evolves towards its steady state value basically depends on the differential loop gain $S_d$.

The coherent optical receiver RX described above (and, in particular, the power adjuster PA comprised therein) is advantageously capable of adjusting the powers of the in-phase component I and the quadrature component Q so as to control both their common variations and their differential variations.

Indeed, the in-phase gain $G_I$ and the quadrature gain $G_Q$ calculated by the power adjuster PA advantageously comprise both a common gain $G_C=2^{-a_c[n]}$ that varies in a faster way and compensates the common variations, and a differential gain $G_D=2^{-a_d[n]}$ that varies in a slower way and compensates the differential variations.

The common variations and the differential variations are advantageously controlled independently, since the common gain $G_C$ and the differential gain $G_D$ are calculated independently by two different feedback loops, according to two different metrics c and d.

Advantageously, the adjustment rate of the common gain $G_C$ and the differential gain $G_D$ may be selected independently, by suitably choosing the common loop gain $S_c$ and the differential loop gain $S_d$. Hence, by selecting $0<S_d<S_c<<1$, the common gain $G_C$ will vary in a faster way (thereby compensating the faster common variations), and while the differential gain $G_D$ will vary in a slower way (thereby compensating the slower differential variations).

Further, the logarithmic control of the in-phase gain $G_I$ and the quadrature gain $G_Q$ advantageously allows keeping the adjustment rates of the in-phase gain $G_I$ and the quadrature gain $G_Q$ substantially constant, independently of the power of the samples $I'_k$ and $Q'_k$ received at the computation module C.

Further, advantageously, the power adjuster PA is very simple to implement. Indeed, the in-phase gain $G_I$ and the quadrature gain $G_Q$ are calculated using very simple components. In particular, while implementing the division $G_D/G_C$ comprised in equation [4b] would require a very complex digital circuit, the digital circuit required for implementing computation of the quadrature gain $G_Q$ according to the above equations [7b] is advantageously very simple. Indeed, implementation of the equation [7b] basically requires the accumulators ACC-C, ACC-D, the quadrature adder $S_Q$ and the quadrature exponential module $S_Q$. On the other hand, the calculation of the quadrature gain $G_Q$ according to the above equations [7b] is much faster than the calculation of the division $G_D/G_C$ comprised in equation [4b]. This is very advantageous, since the calculation of the quadrature gain $G_Q$ must be performed at every clock cycle and should not introduce delay in the processing of the samples $I'_k$ and $Q'_k$.

According to a first variant of this first embodiment, the common metric c may be approximated, instead of using equation [5a] (that basically provides an approximation of the Euclidean norm), according to the following equation:

$$c = \sum_{k=0}^{N-1} (|I'_k| + |Q'_k|). \qquad [5a']$$

Equation [5a'] is basically an approximation of equation [5a] based on an average of an L1 norm. This advantageously allows simplifying the structure of the computation module C, since neither square nor square root operations must be implemented.

According to a second variant of this first embodiment, the common metric c may be approximated according to the following equation:

$$c = \sum_{k=0}^{N-1} \left( \frac{|I'_k| + |Q'_k|}{\sqrt{2}} + \left(1 - \frac{1}{\sqrt{2}}\right) \cdot ||I'_k| - |Q'_k|| \right). \qquad [5a'']$$

Equation [5a''] is basically a further approximation of equation [5a''], which is more accurate than the approximation calculated according to equation [5a']. Indeed, equation [5a] is an Euclidean norm whereby points lying on a circle have a same norm. On the other hand, equation [5a'] is an L1 norm, whereby points lying on a square tilted by 45° have a same norm. Further equation [5a''] is a further type of norm, whereby points lying on an octagon have a same norm. Equation [5a''] is a better approximation of equation [5a] than equation [5a'], since an octagon approximates a circle better than a square.

Even if equation [5a''] is more complex than equation [5a'], its implementation is still advantageously very simple, since it comprises neither square nor square root operations. In other words, equation [5a''] is a trade-off between equation [5a] (that provides an exact value of the common metric c, but that is rather complex to implement) and equation [5a'] (that provides a rough approximation of the common metric c, but that is very simple to implement).

Figure 3:
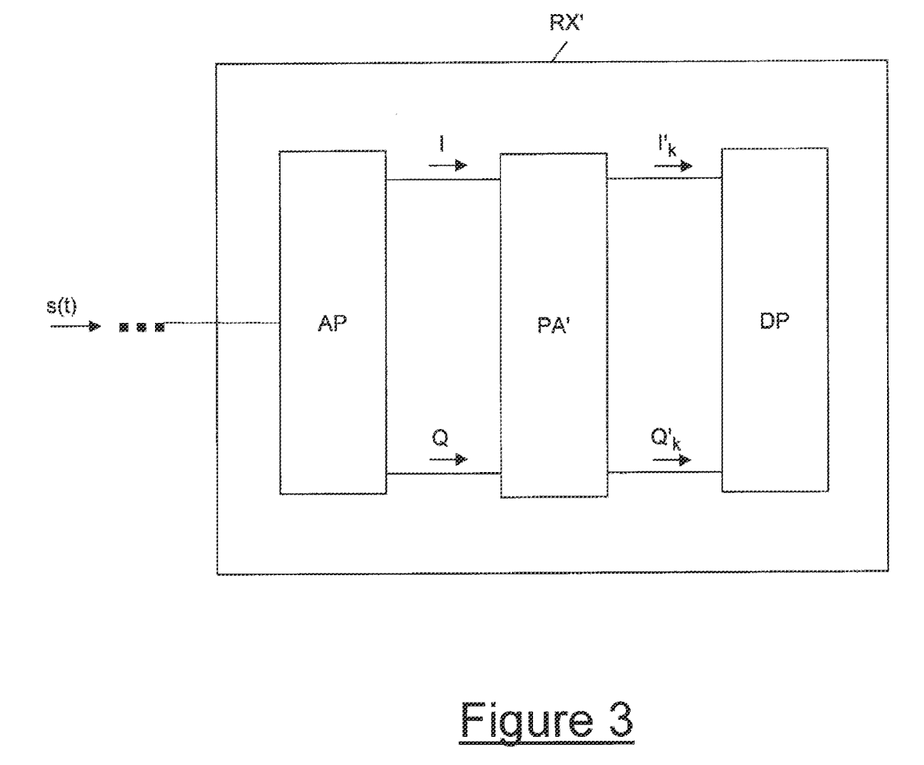
FIG. 3 is a block diagram of a coherent optical receiver according to a second embodiment of the present invention.

FIG. 3 schematically shows a coherent optical receiver RX' according to a second embodiment of the present invention.

The structure of the coherent optical receiver RX' is similar to the structure of the coherent optical receiver RX of FIG. 1. However, differently from the coherent optical receiver RX of FIG. 1, the outputs of the analog portion AP are directly connected to a power adjuster PA'. Hence, according to this second embodiment, the in-phase component I and the quadrature component Q output by the analog portion AP are provided to the power adjuster PA' in an analog form.

Figure 4:
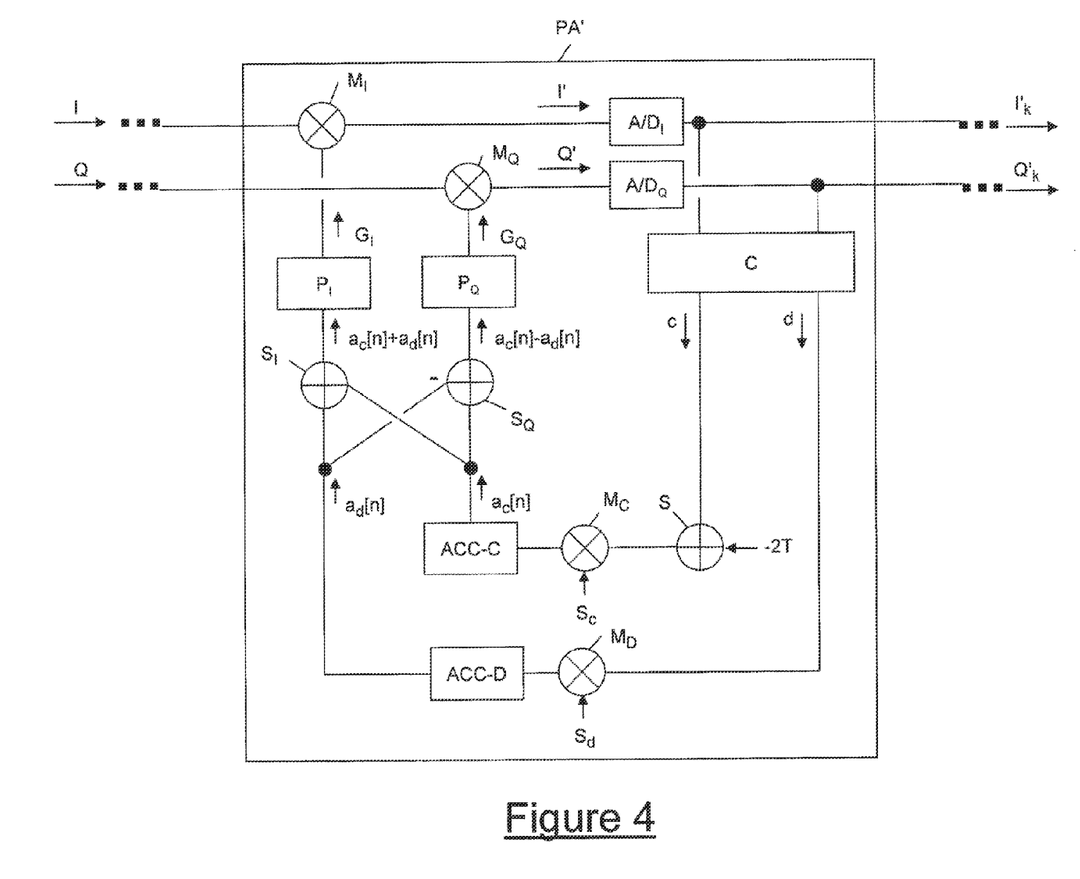
FIG. 4 is a more detailed block diagram of the power adjuster comprised in the coherent optical receiver of FIG. 3.

With reference now to FIG. 4, the structure of the power adjuster PA' according to the second embodiment of the present invention is similar to the structure of the power adjuster PA of FIG. 2. Hence, a detailed description will not be repeated. However, differently from the power adjuster PA of FIG. 2, the in-phase multiplier $M_I$ and the quadrature multiplier $M_Q$ are analog multipliers. In addition, the power adjuster PA' preferably comprises an in-phase analog-to-digital converter $A/D_I$ connected at the output of the in-phase multiplier $M_I$ and a quadrature analog-to-digital converter $A/D_Q$ connected at the output of the quadrature multiplier $M_Q$. The other components of the power adjuster PA' are digital components, similarly to the power adjuster PA according to the first embodiment of the present invention.

The functions of the various elements shown in FIG. 4 (except the analog multipliers) may be provided through the use of dedicated hardware, programmable hardware or a hardware capable of executing software in association with appropriate software. In particular, the functions of the various elements shown in FIG. 4 (except the analog multipliers) are preferably provided through the use of one or more application specific integrated circuits (ASIC) and/or one or more field programmable gate arrays (FPGA) cooperating with the analog multipliers. Preferably, the functions of the various elements shown in FIG. 4 (except the analog multipliers) are provided through the use of a single ASIC or a single FPGA cooperating with the analog multipliers.

The operation of the power adjuster PA' of FIG. 4 will be now described in detail.

As mentioned above, the power adjuster PA' preferably receives at its inputs the in-phase component I and the quadrature component Q in analog form from the analog portion AP.

The in-phase multiplier $M_I$ preferably multiplies the in-phase component I by an in-phase gain $G_I$ that is currently output by the in-phase exponential module $P_I$, thereby continuously providing at its output a power-adjusted in-phase component I'. Substantially at the same time, the quadrature multiplier $M_Q$ preferably continuously multiplies the quadrature component Q by a quadrature gain $G_Q$ that is currently output by the quadrature exponential module $P_Q$, thereby continuously providing at its output a power-adjusted quadrature component Q'.

Then, the in-phase analog-to-digital converter $A/D_I$ preferably samples the power-adjusted in-phase component I', thereby generating a sequence of power-adjusted in-phase component samples $I'_k$. Substantially at the same time, the quadrature analog-to-digital converter $A/D_Q$ preferably samples the power-adjusted quadrature component Q', thereby generating a sequence of power-adjusted quadrature component samples $Q'_k$. In particular, at each clock cycle, N power-adjusted in-phase component samples $I'_k$ and N power-adjusted quadrature component samples $Q'_k$ are generated and provided at the output of the power adjuster PA', N being an integer equal to or higher than 1. The integer N is preferably equal to 128.

The N power-adjusted in-phase component samples $I'_k$ and the N power-adjusted quadrature component samples $Q'_k$ are preferably received also at the computation module C. Subsequent processing of the N power-adjusted in-phase component samples $I'_k$ and the N power-adjusted quadrature component samples $Q'_k$ for computing the in-phase gain $G_I$ and quadrature gain $G_Q$ are substantially identical to the above described processing performed by the power adjuster PA according to the first embodiment of the present invention. Hence, such processing will be only briefly summarized.

First of all, at each clock cycle the N power-adjusted in-phase component samples $I'_k$ and the N power-adjusted quadrature component samples $Q'_k$ are preferably processed by the computation module C for computing a common metric c and a differential metric d. The common metric c may be computed according to any of the above equations [5a], [5a'] or [5a"]. The differential metric d is preferably computed according to the above equation [5b].

Then, the common metric c is forwarded to the adder S, then to the common multiplier $M_C$ and then to the common accumulator ACC-C, that uses it for updating its content according to the above equation [6a]. Substantially at the same time, the differential metric d is forwarded to the differential multiplier $M_D$ and then to the differential accumulator ACC-D, that uses it for updating its content according to the above equation [6b]. It should be noticed that, according to this second embodiment, the nominal value T used by the adder S depends on the features of the in-phase analog-to-digital converter $A/D_I$ and the quadrature analog-to-digital converter $A/D_Q$ (namely, their saturation values and their granularities).

Then, the updated contents $a_d[n]$ and $a_c[n]$ of the accumulators ACC-D and ACC-C are forwarded to the in-phase adder $S_I$ and the quadrature adder $S_Q$. The in-phase adder $S_I$ calculates $a_c[n]+a_d[n]$, and sends the sum to the in-phase exponential module $P_I$ that calculates the in-phase gain $G_I$ according to the above equation [7a]. Besides, the quadrature adder $S_Q$ calculates $a_c[n]-a_d[n]$, and sends the difference to the quadrature exponential module $P_Q$ that calculates the quadrature gain $G_Q$ according to the above equation [7b].

The in-phase gain $G_I$ and the quadrature gain $G_Q$ calculated according to the equations [7a] and [7b] during the current clock cycle based on the N currently received samples $I'_k$ and $Q'_k$ will then be used for multiplying the components I and Q during the next clock cycle.

Therefore, while according to the first embodiment power adjustment is performed at the input of the digital portion DP, according to this second embodiment power adjustment is performed at the input of the analog-to-digital converters $A/D_I$, $A/D_Q$, the analog-to-digital converters $A/D_I$, $A/D_Q$ being integrated in the power adjuster PA' itself.

Also the coherent optical receiver RX' according to the second embodiment (and, in particular, the power adjuster PA' comprised therein) is therefore advantageously capable of adjusting the powers of the in-phase component I and the quadrature component Q so as to control both their common variations and their differential variations, and substantially has the same advantages of the power adjuster PA according to the first embodiment.

In addition, according to the second embodiment, the operation of the analog-to-digital converters is improved, since power adjustment of the in-phase and quadrature components is performed before they are provided at the inputs of the analog-to-digital converters.

Figure 5:
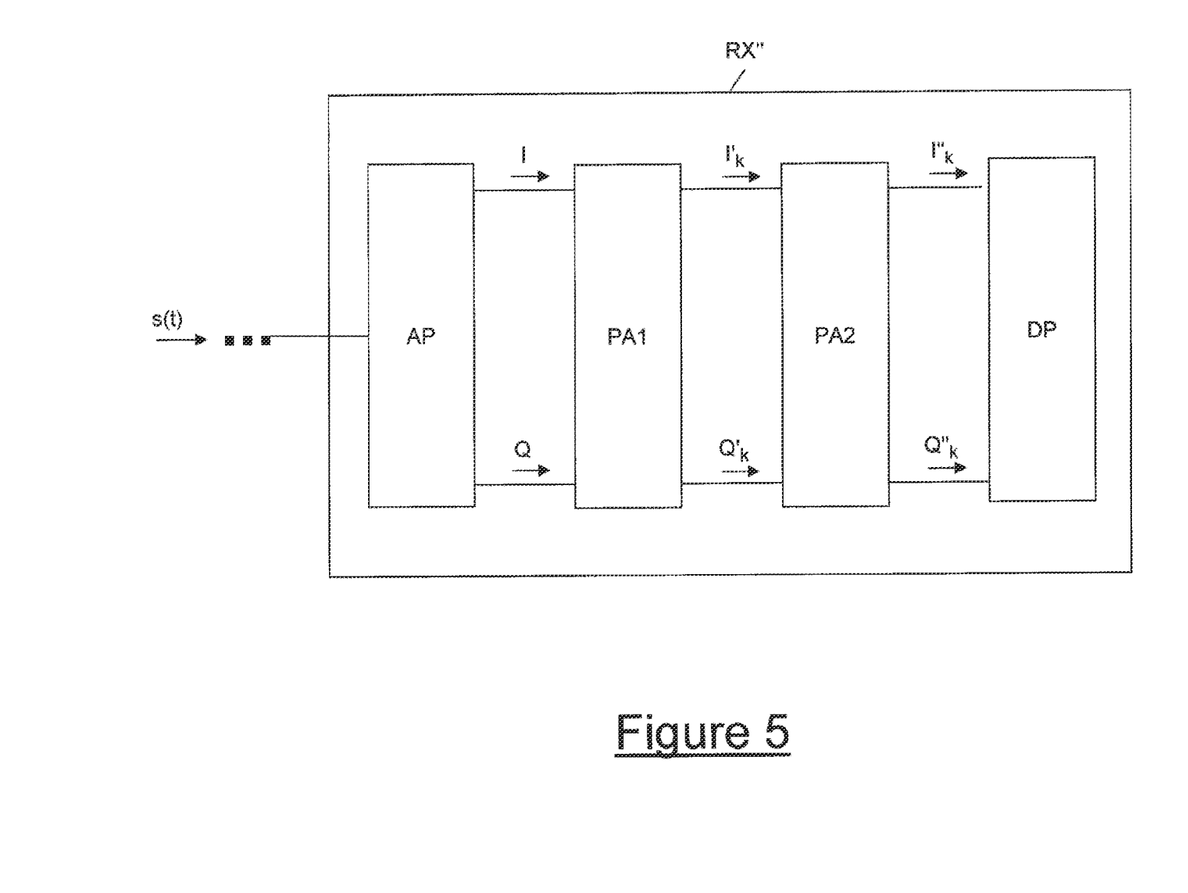
FIG. 5 is a block diagram of a coherent optical receiver according to a third embodiment of the present invention.

FIG. 5 schematically shows a coherent optical receiver RX" according to a third embodiment of the present invention.

The coherent optical receiver RX" is basically a combination of the coherent optical receiver RX according to the first embodiment (FIG. 1) and the coherent optical receiver RX' according to the second embodiment (FIG. 3).

In particular, the coherent optical receiver RX" comprises an analog portion AP, a first power adjuster PA1 connected at the output of the analog portion AP, a second power adjuster PA2 connected at the output of the first power adjuster PA1, and a digital portion DP connected at the output of the second power adjuster PA2.

Preferably, the first power adjuster PA1 is similar to the power adjuster PA' according to the second embodiment of the present invention (FIG. 4). In other words, the first power adjuster PA1 comprises the analog-to-digital converters $A/D_I$, $A/D_Q$. Further, the multipliers $M_I$, $M_Q$ are analog devices suitable for adjusting the power of the components I and Q before they are received at the analog-to-digital converters $A/D_I$, $A/D_Q$. Hence, according to this third embodiment, the first power adjuster PA1 performs a first power adjusting operation for keeping the powers of the components I and Q substantially equal to a first target value T1, that depends on the features (namely, saturation value and granularity) of the analog-to-digital converters $A/D_I$, $A/D_Q$.

On the other hand, the second power adjuster PA2 is similar to the power adjuster PA according to the first embodiment of the present invention (FIG. 2). In other words, the second power adjuster PA2 is a totally digital module suitable for further adjusting the power of the components I and Q after analog-to-digital conversion, before they are received at the digital portion DP. Hence, the second power adjuster PA2 performs a second power adjusting operation for keeping the powers of the components I and Q (after they are sampled) substantially equal to a second target value T2 that depends on the features (namely, saturation value and granularity) of the digital portion DP.

Preferably, the first power adjustment may be rough, while the second power adjustment may be finer.

Also according to this third embodiment, both common variations are differential variations are advantageously compensated.

The invention claimed is:

1. An optical coherent receiver for an optical communication network, said optical coherent receiver being configured to receive a modulated optical signal and to process said modulated optical signal for generating an in-phase component and a quadrature component, said in-phase component and said quadrature component being electrical signals, said optical coherent receiver comprising a power adjuster in turn comprising:
   a multiplying unit configured to multiply said in-phase component by an in-phase gain thereby providing a power-adjusted in-phase component, and to multiply said quadrature component by a quadrature gain thereby providing a power-adjusted quadrature component; and
   a digital circuit connected between output and input of said multiplying unit and configured to compute:
      a common gain indicative of a sum of a power of said power-adjusted in-phase component and a power of said power-adjusted quadrature component, and a differential gain indicative of a difference between said power of said power-adjusted in-phase component and said power of said power-adjusted quadrature component; and said in-phase gain as a product between said common gain and said differential gain, and said quadrature gain as a ratio between said common gain and said differential gain.

2. An optical coherent receiver according to claim 1, wherein it further comprises an analog-to-digital unit connected at the input of said power adjuster, said analog-to-digital unit being configured to sample said in-phase component and said quadrature component for providing N in-phase component and N quadrature component samples to said power adjuster at each clock cycle of a clock signal generated at said optical coherent receiver, N being an integer equal to or higher than 1.

3. An optical coherent receiver according to claim 2, wherein said multiplying unit is a digital unit configured to multiply said N in-phase component samples by said in-phase gain thereby providing N power-adjusted in-phase component samples, and to multiply said N quadrature component samples by said quadrature gain thereby providing N power-adjusted quadrature component samples.

4. An optical coherent receiver according to claim 1, wherein said multiplying unit is an analog unit.

5. An optical coherent receiver according to claim 4, wherein said power adjuster comprises an analog-to-digital unit connected at the output of said multiplying unit, said analog-to-digital unit being configured to sample said power-adjusted in-phase component and said power-adjusted quadrature component for providing N power-adjusted in-phase component samples and N power-adjusted quadrature component samples at each clock cycle of a clock signal generated at said optical coherent receiver, N being an integer equal to or higher than 1.

6. An optical coherent receiver according to claim 3, wherein said digital circuit comprises a computation module configured to receive said N power-adjusted in-phase component samples and said N power-adjusted quadrature component samples and to calculate a common metric according to the following equation:

$$c = \sum_{k=0}^{N-1} \sqrt{|I'_k|^2 + |Q'_k|^2},$$

c being said common metric, $I'_k$ being said N power-adjusted in-phase component samples and $Q'_k$ being said N power-adjusted quadrature component samples.

7. An optical coherent receiver according to claim 3, wherein said digital circuit comprises a computation module configured to receive said N power-adjusted in-phase component samples and said N power-adjusted quadrature component samples and to calculate a common metric according to the following equation:

$$c = \sum_{k=0}^{N-1} \left( \frac{|I'_k| + |Q'_k|}{\sqrt{2}} + \left(1 - \frac{1}{\sqrt{2}}\right) \cdot ||I'_k| - |Q'_k|| \right),$$

c being said common metric, $I'_k$ being said N power-adjusted in-phase component samples and $Q'_k$ being said N power-adjusted quadrature component samples.

8. An optical coherent receiver according to claim 6, wherein said digital circuit further comprises a cascade of an adder, a common multiplier and a common accumulator connected at the output of said computation module, wherein:

said adder is configured to calculate c−2T, T being a target value that the power of said power-adjusted in-phase component and the power of said power-adjusted quadrature component should reach;

said common multiplier is configured to calculate $S_c \cdot$(c−2T), $S_c$ being a common loop gain; and said common accumulator is configured to update its content ($a_c[n-1]$) by adding $S_c \cdot$(c−2T) to it, thereby providing an updated common content ($a_c[n]$).

9. An optical coherent receiver according to claim 8, wherein said computation module is further configured to calculate a differential metric according to the following equation:

$$d = \sum_{k=0}^{N-1} (|I'_k| - |Q'_k|),$$

d being said differential metric, $I'_k$ being said N power-adjusted in-phase component samples and $Q'_k$ being said N power-adjusted quadrature component samples.

10. An optical coherent receiver according to claim 9, wherein said digital circuit further comprises a cascade of a differential multiplier and a differential accumulator connected at the output of said computation module, wherein:

said differential multiplier is configured to calculate $S_d \cdot d$, $S_d$ being a differential loop gain; and said differential accumulator is configured to update its content ($a_d[n-1]$) by adding $S_d \cdot d$ to it, thereby providing an updated differential content ($a_d[n]$).

11. An optical coherent receiver according to claim 10, wherein said differential loop gain is lower than said common loop gain.

12. An optical coherent receiver according to claim 8, wherein said digital circuit further comprises an in-phase adder and a quadrature adder connected both to said common accumulator and to said differential accumulator, wherein:

said in-phase adder is configured to provide a sum ($a_c[n]+a_d[n]$) of said updated common content ($a_c[n]$) and said updated differential content ($a_d[n]$); and said quadrature adder is configured to provide a difference ($a_c[n]-a_d[n]$) between said updated common content ($a_c[n]$) and said updated differential content ($a_d[n]$).

13. An optical coherent receiver according to claim 12, wherein said digital circuit further comprises an in-phase exponential module connected between said in-phase adder and said multiplying unit and a quadrature exponential module connected between said quadrature adder and said multiplying unit, wherein:

said in-phase exponential module is configured to calculate said in-phase gain as a negative exponential function of said sum; and said quadrature exponential module is configured to calculate said quadrature gain as a negative exponential function of said difference.

14. A node for a communication network comprising an optical coherent receiver, said optical coherent receiver being configured to receive a modulated optical signal and to process said modulated optical signal for generating an in-phase component and a quadrature component, said in-phase component and said quadrature component being electrical signals, said optical coherent receiver comprising a power adjuster in turn comprising:
- a multiplying unit configured to multiply said in-phase component by an in-phase gain thereby providing a power-adjusted in-phase component, and to multiply said quadrature component by a quadrature gain thereby providing a power-adjusted quadrature component; and
- a digital circuit connected between output and input of said multiplying unit and configured to compute:
  - a common gain indicative of a sum of a power of said power-adjusted in-phase component and a power of said power-adjusted quadrature component, and a differential gain indicative of a difference between said power of said power-adjusted in-phase component and said power of said power-adjusted quadrature component; and
  - said in-phase gain as a product between said common gain and said differential gain, and said quadrature gain as a ratio between said common gain and said differential gain.

15. A method for adjusting power of an in-phase component and a quadrature component of a modulated optical signal received at an optical coherent receiver for an optical communication network, said in-phase component and said quadrature component being electrical signals, said method comprising:

multiplying said in-phase component by an in-phase gain thereby providing a power-adjusted in-phase component, and multiplying said quadrature component by a quadrature gain thereby providing a power-adjusted quadrature component; and computing:
- a common gain indicative of a sum of a power of said power-adjusted in-phase component and a power of said power-adjusted quadrature component, and a differential gain indicative of a difference between said power of said power-adjusted in-phase component and said power of said power-adjusted quadrature component; and
- said in-phase gain as a product between said common gain and said differential gain, and said quadrature gain as a ratio between said common gain and said differential gain.

* * * * *